(12) United States Patent
Storch

(10) Patent No.: US 7,898,077 B2
(45) Date of Patent: Mar. 1, 2011

(54) ADJUSTABLE THREADED CORES FOR LED THERMAL MANAGEMENT

(75) Inventor: David Robert Storch, Springfield, OH (US)

(73) Assignee: Honeywell International Inc., Morristown, NJ (US)

(*) Notice: Subject to any disclaimer, the term of this patent is extended or adjusted under 35 U.S.C. 154(b) by 73 days.

(21) Appl. No.: 12/370,453

(22) Filed: Feb. 12, 2009

(65) Prior Publication Data

US 2010/0200984 A1 Aug. 12, 2010

(51) Int. Cl.
*H01L 23/10* (2006.01)
*H01L 23/34* (2006.01)

(52) U.S. Cl. ........................ 257/707; 257/706
(58) Field of Classification Search ................ 257/706, 257/707, 704, 710, 99, 100, 81, 433
See application file for complete search history.

(56) References Cited

U.S. PATENT DOCUMENTS

| | | | | |
|---|---|---|---|---|
| 3,229,756 A * | 1/1966 | Keresztury | ................... | 165/67 |
| 3,549,958 A | 12/1970 | Margolien | | |
| 3,728,584 A * | 4/1973 | Kuhlow | ........................ | 361/712 |
| 4,340,902 A * | 7/1982 | Honda et al. | ................. | 257/722 |
| 4,420,767 A * | 12/1983 | Hodge et al. | ................. | 257/713 |
| 4,607,685 A * | 8/1986 | Mitchell, Jr. | ............... | 165/80.3 |
| 5,397,919 A * | 3/1995 | Tata et al. | .................... | 257/717 |
| 5,667,870 A * | 9/1997 | McCullough | ............... | 428/131 |
| 5,789,813 A * | 8/1998 | Kirkland et al. | ............. | 257/712 |
| 5,945,736 A * | 8/1999 | Rife et al. | .................... | 257/719 |
| 6,481,874 B2 | 11/2002 | Petroski | | |
| 6,541,800 B2 * | 4/2003 | Barnett et al. | ................. | 257/98 |
| 7,000,683 B2 | 2/2006 | Liang et al. | | |
| 2006/0131602 A1 * | 6/2006 | Ouderkirk et al. | ........... | 257/100 |
| 2008/0197374 A1 * | 8/2008 | Sung | ........................... | 257/99 |
| 2010/0001309 A1 * | 1/2010 | Wang et al. | .................... | 257/99 |

* cited by examiner

*Primary Examiner*—S. V Clark
(74) *Attorney, Agent, or Firm*—Black Lowe & Graham PLLC

(57) ABSTRACT

Adjustable threaded cores for LED thermal management. The cores provide a direct thermal path between a LED and a heat sink while minimizing gaps and stresses between materials. The system includes a heat generating object, a first substrate housing containing a threaded hole beginning adjacent to the heat generating object, a second substrate having compatible threading with the threaded hole, and a third substrate including a heat sink. The second substrate has a higher thermal conductivity in comparison to the first substrate. The threaded hole and threaded core may terminate adjacent to the heat sink or may extent into the heat sink.

20 Claims, 3 Drawing Sheets

ADJUSTABLE THREADED CORES FOR LED THERMAL MANAGEMENT

BACKGROUND OF THE INVENTION

A number of attempts have been made to replace incandescent and halogen bulbs with Light Emitting Diodes (LEDs) in various lighting applications because of their relatively small power consumption and long life. LEDs are more efficient than bulbs at converting electricity into light. LEDs are also durable and immune to filament breakage due to shock or vibration. When heat from the LEDs is properly managed, LEDs can last several times longer than incandescent or halogen bulbs. Accordingly, LEDs require less frequent maintenance and/or replacement compared to bulbs.

However, LED products are not without design challenges. LED systems require significant design efforts to keep component junction temperatures at acceptable levels. A high-power LED can generate a substantial amount of heat. Overheating could cause the LED system to fail prematurely and possibly damage other objects located nearby.

LEDs are frequently attached to circuit board materials that are poorly suited to dissipate heat. Also, most current LED mounting designs require heat to travel through multiple materials (LED, circuit board, heat sink) to reach the ambient environment. Thermal resistances occur through each material and at each junction between materials in the system. Any air gaps between materials add thermal resistance. The gaps can be eliminated, but not without expensive precision fabrication and mounting techniques. If materials are forced together, the resulting configuration could strain the LEDs or other circuit components, leading to system failure. In designs containing multiple LEDs, these challenges not only become increasingly difficult, but also contain LED position and assembly tolerance concerns. Solutions to these challenges are often costly and difficult to replicate.

SUMMARY OF THE INVENTION

The present invention provides an adjustable threaded core providing a direct thermal path between a heat generating object and a heat sink.

The present invention includes a system for facilitating a thermal path between a heat generating object and an ambient environment. The system includes a heat generating object, a first substrate housing containing a threaded hole beginning adjacent to the heat generating object, a second substrate having compatible threading with the threaded hole, and a third substrate including a heat sink. The second substrate has a higher thermal conductivity in comparison to the first substrate. In accordance with other aspects of the invention, the threaded hole extends into the third substrate and possibly the heat sink and fins. The second substrate is adjustable to be in contact with the heat generating object and the third substrate.

In accordance with still further aspects of the invention, the heat generating object is mounted on and/or powered by a circuit board.

In accordance with yet other aspects of the invention, the heat generating object comprises a semiconductor device or an LED.

As will be readily appreciated from the foregoing summary, the invention provides an adjustable direct thermal path between a heat generating object and a heat sink.

BRIEF DESCRIPTION OF THE DRAWINGS

Preferred and alternative embodiments of the present invention are described in detail below with reference to the following drawings.

DETAILED DESCRIPTION OF THE INVENTION

Figure 1:
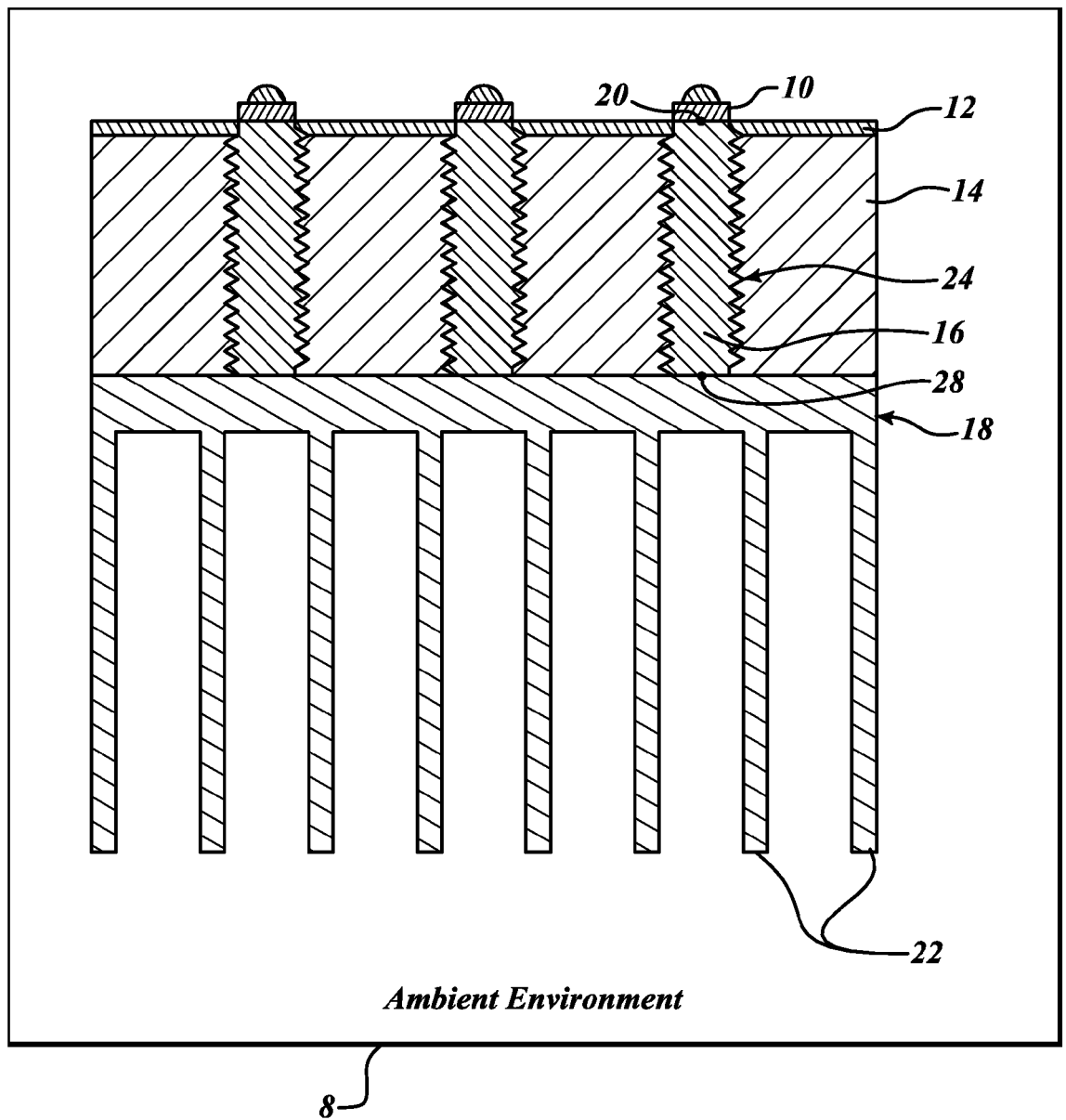
FIG. 1 is cross-sectional view showing LED mount formed in accordance with the present invention.

FIG. 1 shows a Light Emitting Diode (LED) threaded core assembly 8 including a circuit board 12, a plurality of LEDs 10, a plurality of threaded holes 24, and a plurality of threaded cores 16 included within a housing 14. The circuit board 12 is configured to receive the plurality of LEDs 10. Adjustable threaded cores for LED thermal management provide a direct thermal path between the LED 10 and the heat sink 18 while minimizing both gaps and stresses between materials.

In an exemplary embodiment, the circuit board 12 is a printed circuit board (PCB). The circuit board 12 can be attached to a housing 14 with screws, adhesive, or clamps. The housing 14 can be attached to a heat sink 18 with screws, adhesive, or clamps.

The threaded hole 24 extends within the housing 14 from a first junction 20 to a second junction 28. The threaded hole 24 is formed with conventional machining techniques. The threaded hole 24 includes a tapered thread pattern. Correspondingly, the outer surface of the threaded core 16 includes threading compatible with the threads of the threaded hole 24. The threading has been applied to the threaded hole 24 and threaded core 16 using standard machining and fabrication techniques.

The threaded core 16 is adjustable within the threaded hole 24. If the threaded core 16 is rotated angularly, the threaded core 16 translates up or down in the threaded hole 24. The threaded core 16 may be rotated using a screw driver or Allen wrench from the end opposite the LED 10.

The threaded core 16 is adjusted to a position adjacent to and/or in thermal communication with the LED 10 at the first junction 20. Similarly, the threaded core 16 is adjustable to be adjacent to the heat sink 18 at the second junction 28. This forms a thermal path from the LED 10 to the ambient environment around a plurality of fins 22 of the heat sink 18. More specifically, heat generated by the LED 10 is transferred through the threaded core 16 into the heat sink 18 and then to the ambient environment. The heat sink 18 is made of a material with high thermal transfer properties, such as aluminum.

The material used in the threaded core 16 also has relatively high thermal transfer properties, especially relative to the material of the housing 14. Possible materials of the threaded core 16 include, but are not limited to, aluminum, copper, carbon foam, graphite, or comparable materials. Additionally, the threaded core 16 could include a heat pipe or other self-contained heat transfer system.

An adhesive, grease, or phase change material (PCM) may be added to the threads to provide lubrication to the threaded core 16 and threaded hole 24. Once the thermal core 16 has been adjusted to the desired position, e.g. adjacent to the LED 10, any applied adhesive may be cured to prevent the threaded core 16 from translating. Also, a thermal grease, thermal adhesive, or PCM may be applied to the threaded core 16, the LED 10, or the heat sink 18 to maximize conductive heat transfer at the first junction 20 and/or the second junction 28.

Figure 2:
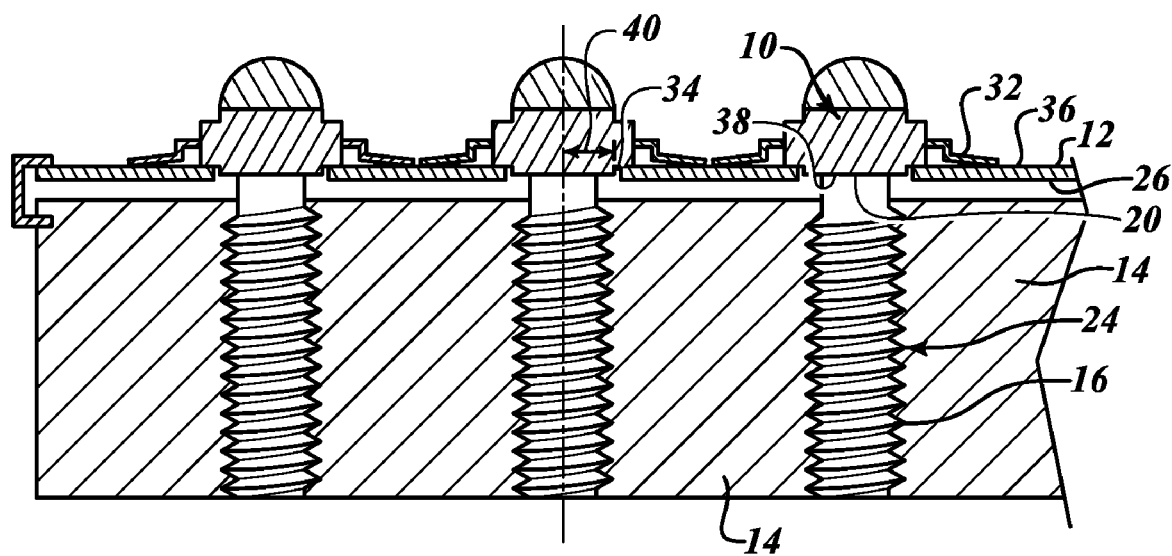
FIG. 2 is a partial cross-sectional view showing a circuit board, LED, and threaded cores formed in accordance with embodiments of the present invention.

FIG. 2 shows a more detailed view of the plurality of LEDs 10 attached to the circuit board 12. A plurality of leads 32 electrically couples the LEDs 10 to the circuit board 12. The circuit board 12 provides power to the LEDs 10 through the leads 32. The circuit board 12 has an opening 34 to allow thermal communication between the LED 10 and the threaded core 16. The circuit board 12 has a surface 36. The leads 32 are located above the surface 36. The LED 10 has a slug 38, which is positioned to be adjacent to and/or in thermal communication with the threaded core 16. The threaded core 16 and the threaded hole 24 have a radius 40. It should be understood that the radius 40 of the threaded hole 24 and the threaded core 16 may be modified to achieve a desired heat transfer with a variety of LED types and configurations. It should be understood that radius 40 of the threaded core 16 and the threaded hole 24 may differ.

Figure 3:
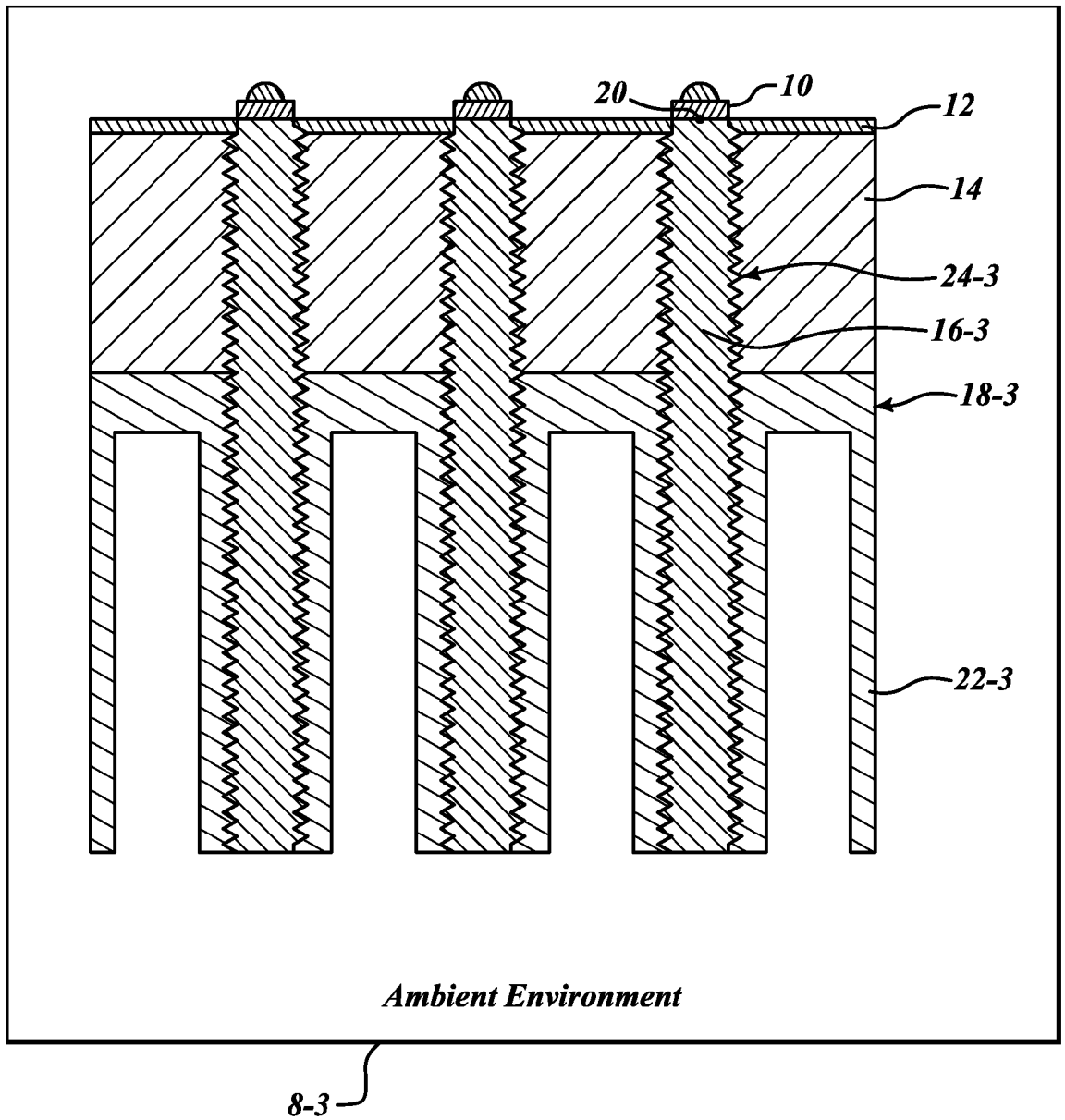
FIG. 3 is a cross-sectional view showing an alternate configuration of the present invention.

FIG. 3 shows an alternative embodiment where a threaded hole 24-3 extends into at least a portion of a heat sink 18-3. In this embodiment, the threaded hole 24-3 extends from the LED 10-3 through the housing 14, the heat sink 18-3, and a plurality of fins 22-3. Alternatively, the threaded core 16-3 could extend through a portion of the heat sink 18-3 and bypass the fins 22-3. In an exemplary embodiment, the heat sink 18-3 may contain an unthreaded hole. In the exemplary embodiment, the threaded core 16-3 has portion that is unthreaded corresponding to the hole within the heat sink 18-3. In the exemplary embodiment the threaded core 16-3 would be adjusted and then the heat sink 18-3 would be attached to the housing 14.

The threaded core assembly 8, 8-3 could be configured to have a lower weight than the prior art. More specifically, the density of the heat sink 18, 18-3 may be much lower than the prior art, because the threaded core 16, 16-3 carries much more of the heat load, leaving the threaded core assembly 8, 8-3 with a weight advantage. Moreover, the increased efficiency of heat transfer made possible by the threaded core 16, 16-3 could allow for different designs of the heat sink 18, 18-3 utilizing lighter and/or less expensive materials.

The LEDs 10 may be arranged in various configurations. In an alternative embodiment, the invention could include just one LED 10. The leads 32 could be located below the surface 36 of the circuit board 12. In other embodiments, the threaded core assembly 8, 8-3 could comprise a heat generating object other than just an LED. As an example, the heat generating object could include an LED and LED mounting components that could include materials that facilitate heat transfer such as a thermal interface material or similar device.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is Claimed are defined as follows:

1. A system comprising:
   at least one heat generating object;
   a first substrate having at least one threaded hole, the threaded hole having an end adjacent to the heat generating object;
   a second substrate having compatible threading with the threaded hole, the second substrate being movable relative to the threaded hole; and
   a third substrate adjacent to the first substrate,
   wherein the second substrate is capable of being adjusted within the threaded hole to a position adjacent to both the heat generating object and the third substrate,
   wherein the second substrate provides a thermal path between the heat generating device and the third substrate,
   wherein the third substrate comprises a heat sink.

2. The system of claim 1, further comprising an adhesive applied to at least one of the threading of the second substrate or the threading of the first substrate, the adhesive capable of undergoing a curing process that would prevent substantially all movement of the second substrate relative to the first substrate.

3. The system of claim 1, further comprising at least one of a thermal grease or a phase change material applied to at least one of the threading of the threaded hole, the threading of the first substrate, or in a junction located between the second substrate and the heat generating object.

4. The system of claim 1, wherein the heat generating object includes a semiconductor device.

5. The system of claim 4, wherein the semiconductor device includes a light emitting diode.

6. The system of claim 1, wherein the second substrate comprises at least one of aluminum or copper.

7. The system of claim 1, wherein the second substrate comprises at least one of heat pipe or graphite.

8. The system of claim 1, wherein the heat generating device is mounted on a circuit board.

9. A system comprising:
   at least one heat generating object;
   a first substrate;
   a second substrate;
   a third substrate adjacent to the first substrates
   an ambient environment adjacent to at least a portion of the third substrate; and
   a threaded hole having a first end adjacent to the heat generating object and a second end, the second end is at least one of within the third substrate or coterminous with the third substrate and the ambient environment,
   wherein the second substrate has compatible threading with the threaded hole, the second substrate being movable relative to the threaded hole,
   wherein the second substrate is capable of being adjusted within the threaded hole to a position adjacent to the heat generating object,
   wherein the second substrate provides a thermal path between the heat generating object and the third substrate,
   wherein the third substrate comprises a heat sink.

10. The system of claim 9, further comprising an adhesive applied to at least one of the threading of the threaded hole or the threading of the first substrate, the adhesive capable of undergoing a curing process that would prevent substantially all movement of the second substrate relative to the first substrate.

11. The system of claim 9, further comprising at least one of a thermal grease or a phase change material applied to at least one of the threading of the threaded hole the threading of the first substrate, or a junction between the second substrate and the heat generating object.

12. The system of claim 9, wherein the heat generating object includes a semiconductor device.

13. The system of claim 12, wherein the semiconductor device includes a light emitting diode.

14. The system of claim 9, wherein the second substrate comprises at least one of aluminum or copper.

15. The system of claim 9, wherein the second substrate comprises at least one of heat pipe or graphite.

16. The system of claim 9, wherein the heat generating object is mounted on a circuit board.

17. The system of claim 9, wherein the heat generating object is powered by a circuit board.

18. The system of claim 1, wherein the third substrate comprises a threaded cavity configured to receive the second substrate.

19. A system comprising:
- a plurality of heat generating objects;
- a first substrate having a plurality of threaded holes, the threaded hole having an end adjacent to a corresponding one of the heat generating objects;
- a plurality of second substrates having compatible threading with the threaded hole, the plurality of second substrates being movable relative to the respective threaded hole; and
- a third substrate adjacent to the first substrate,
- wherein each of the plurality of second substrates is capable of being adjusted within the respective threaded hole to a position adjacent to one of the heat generating objects and the third substrate,
- wherein the plurality of second substrates provide a thermal path between the plurality of heat generating devices and the third substrate,
- wherein the third substrate comprises a heat sink.

20. The system of claim 19, wherein the third substrate comprises a plurality of threaded cavities configured to receive the plurality of second substrates.

* * * * *